United States Patent
Hirano et al.

(10) Patent No.: US 8,338,715 B2
(45) Date of Patent: Dec. 25, 2012

(54) PCB WITH SOLDERING PAD PROJECTIONS FORMING FILLET SOLDER JOINTS AND METHOD OF PRODUCTION THEREOF

(75) Inventors: Yoshikazu Hirano, Kawasaki (JP); Mitsunori Abe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 882 days.

(21) Appl. No.: 12/222,178

(22) Filed: Aug. 4, 2008

(65) Prior Publication Data

US 2009/0056985 A1    Mar. 5, 2009

(30) Foreign Application Priority Data

Aug. 28, 2007    (JP) .................................. 2007-221104

(51) Int. Cl.
*H05K 1/03* (2006.01)
*H05K 1/16* (2006.01)

(52) U.S. Cl. ........................ 174/255; 174/260

(58) Field of Classification Search ............ 174/255
See application file for complete search history.

(56) References Cited

U.S. PATENT DOCUMENTS

| | | | | |
|---|---|---|---|---|
| 5,683,788 A * | 11/1997 | Dugan et al. | .................. | 428/209 |
| 6,054,653 A * | 4/2000 | Hansen et al. | ................ | 174/261 |
| 6,143,992 A | 11/2000 | Sato et al. | | |
| 6,303,872 B1 * | 10/2001 | Jairazbhoy et al. | ........... | 174/260 |
| 6,316,736 B1 * | 11/2001 | Jairazbhoy et al. | ........... | 174/260 |
| 6,566,611 B2 * | 5/2003 | Kochanowski et al. | ...... | 174/261 |
| 6,700,204 B2 * | 3/2004 | Huang et al. | .................. | 257/774 |
| 7,084,353 B1 * | 8/2006 | Downes | ........................ | 174/261 |
| 7,186,926 B2 * | 3/2007 | Maeno | ......................... | 174/260 |
| 2005/0056458 A1 * | 3/2005 | Sugiura | .......................... | 174/260 |
| 2005/0266668 A1 | 12/2005 | Sawada et al. | | |
| 2007/0089901 A1 * | 4/2007 | Yatsu et al. | .................... | 174/260 |
| 2008/0272489 A1 * | 11/2008 | Fang et al. | ..................... | 257/738 |

FOREIGN PATENT DOCUMENTS

| | | | |
|---|---|---|---|
| JP | 3-3391 | | 1/1991 |
| JP | 11102926 A | * | 4/1999 |
| JP | 11-177224 | | 7/1999 |
| JP | 2005-228959 | | 8/2005 |
| JP | 2005228959 A | * | 8/2005 |
| JP | 2006-339524 | | 12/2006 |
| JP | 2007-116040 | | 5/2007 |
| KR | 10-2006-0126368 | | 12/2008 |

OTHER PUBLICATIONS

Machine translation of Japanese Published Patent Application No. 2005-228959 (Reference AG in the IDS filed Aug. 4, 2008).
English Translation of Chinese Office Action issued Dec. 18, 2009 in corresponding Chinese Patent Application 200810213948.X.

(Continued)

*Primary Examiner* — Timothy Thompson
*Assistant Examiner* — Nathan Milakovich
(74) *Attorney, Agent, or Firm* — Staas & Halsey LLP

(57) ABSTRACT

A printed circuit board provided with board electrodes, wherein each board electrode is provided with a board electrode base, for carrying by soldering a bottom electrode arranged at a bottom of an electronic device inside from outer edges of the electronic device, arranged inside from the outer edges of the electronic device and a projection projecting out from the board electrode base, narrower in width than the board electrode base, and connected to an interconnect of the printed circuit board.

7 Claims, 4 Drawing Sheets

OTHER PUBLICATIONS

English Translation of Korean Office Action issued Jun. 8, 2010 in corresponding Korean Patent Application 10-2008-0083434.
Japanese Office Action mailed Nov. 22, 2011 issued in corresponding Japanese Patent Application No. 2007-221104.
Taiwanese Office Action issued Aug. 25, 2011 in corresponding Taiwanese Patent Application 097128997.

* cited by examiner

PCB WITH SOLDERING PAD PROJECTIONS FORMING FILLET SOLDER JOINTS AND METHOD OF PRODUCTION THEREOF

BACKGROUND OF THE INVENTION

1. Field of the Invention

The present invention relates to a printed circuit board and a method of production of an electronic apparatus.

2. Description of the Related Art

In the past, integrated circuits, resistors, capacitors, and numerous other electronic devices have been surface mounted on printed circuit boards by reflow soldering.

Normally, for surface mounting an electronic device on a printed circuit board by reflow soldering, first a printing plate for printing solder paste is arranged over the board electrodes of the printed circuit board and cream-like solder paste is coated on the printing plate to coat the board electrodes with solder paste. Next, the printing plate is removed, the electronic device is placed on the printed circuit board, and solder melted by hot air heating or infrared heating called "reflow" is used to bond the electronic device electrodes and the board electrodes.

A printed circuit board carrying an electronic device produced by reflow soldering in this way is inspected by an inspection for the appearance or an electrical test connecting the board electrodes and device electrodes and then used to produce an electronic apparatus. However, if the solder melted by the reflow does not stop at between the electronic device electrodes and the board electrodes and leaks outside of the electronic device, sometimes the warping of the electronic device and the printed circuit board at the time of reflow will result in soldering failure etc. and the problem of a drop in yield of the electronic apparatuses.

Using FIGS. 1A to 1C, an example of soldering the board electrodes provided on a printed circuit board and device bottom electrodes provided at an electronic device will be explained. FIG. 1A is a side view showing a device electrode arranged at the bottom of an electronic device 20a, that is, a device bottom electrode 22a, a board electrode 12a of the printed circuit board 10a, and a solder joint 24a, FIG. 1B is a top view showing the positional relationship between the device bottom electrode 22a and the board electrode 12a, and FIG. 1C shows a mode of mounting an electronic device 20b on the printed circuit board 10b.

As shown in FIG. 1A, at the solder joint 24a between the electronic device electrode 22a and board electrode 12a, the solder melted at the time of the reflow did not stop between the electrodes and leaked to the outside of the electronic device. There was less solder between the electrodes and a low level of height of solder between the electrodes.

As shown in FIG. 1A, if the amount of solder between the electrodes is small, as shown in FIG. 1C, when warping of the electronic device 20b and printed circuit board 10b occurs due to the thermal stress at the time of reflow, unless the molten solder is high enough to allow for that deformation, the device bottom electrode 22b and board electrode 12b will end failing to bond.

Japanese Laid-open Patent Publication No. 2005-228959 proposes a method of using electrodes at the side surface of a device and firmly bonding with the electrodes at the side surfaces of the device so as to avoid the phenomenon of such bonding failure between electrodes at the time of reflow.

The method proposed requires that electrodes of an electronic device be made device side electrodes. However, along with the higher density of electronic apparatuses, electronic devices are being made smaller in size. It is therefore difficult to form side electrodes at the outer edges of an electronic device. Further, device side electrodes are arranged to cover the outer edges of the electronic device. The board electrodes are extended in the direction of the outer edges of the electronic device and the area occupied by the electronic device on the printed circuit board is increased, so there is the problem that this impairs the increased density of electronic apparatuses.

SUMMARY OF THE INVENTION

An object of the present invention is to provide a printed circuit board and/or a method of production of an electronic apparatus for carrying an electronic device having device bottom electrodes by soldering on a printed circuit board so as to prevent bonding failure between the electronic device and the printed circuit board.

According to an aspect of the present invention, there is provided a printed circuit board provided with board electrodes, wherein each the board electrode is provided with: a board electrode base, for carrying by soldering a bottom electrode arranged at a bottom of an electronic device inside from outer edges of the electronic device, arranged inside from the outer edges of the electronic device and a projection projecting out from the board electrode base, narrower in width than the board electrode base, and connected to an interconnect of the printed circuit board.

Preferably, the board electrode base is larger than the bottom electrode. In one embodiment, a surrounding of the board electrode can be treated with a solder resist.

According to another aspect of the present invention, there is provided a method of production of an electronic apparatus comprising: forming, on a printed circuit board, board electrodes, each provided with a board electrode base, for carrying by soldering a bottom electrode arranged at a bottom of an electronic device inside from outer edges of the electronic device, arranged inside from the outer edges of the electronic device and a projection projecting out from the board electrode base, narrower in width than the board electrode base, and connected to an interconnect of the printed circuit board; arranging on the board electrode a printing plate having patterns from which the board electrodes are exposed; coating the printing plate with a solder paste to coat the exposed board electrodes with the solder paste; removing the printing plate and placing the bottom electrodes on the board electrode bases of the board electrodes coated with the solder paste so as to carry the electronic device; and soldering together the board electrode bases and the bottom electrodes.

Preferably, the patterns of the printing plate from which the board electrodes are exposed are rectangular, circular, elliptical, semicircular, or fan-shaped. In one embodiment, a surrounding of the board electrodes can be treated with solder resist.

According to the present invention, a projection is provided at a board electrode, so the molten solder remains between the electrodes, the height of the molten solder between the electrodes is raised, and that molten solder absorbs warping of the electronic device and printed circuit board at the time of reflow, so it is possible to prevent bonding failure between an electronic device having device bottom electrodes and a printed circuit board and possible to prevent a drop in yield of the electronic apparatuses surface mounting electronic devices having device bottom electrodes.

Furthermore, according to the present invention, it is possible to prevent bonding failure of device bottom electrodes, which occupy a smaller area on a printed circuit board than device side electrodes, at a printed circuit board and thereby provide a higher density electronic apparatus.

BRIEF DESCRIPTION OF THE DRAWINGS

The present invention will be more clearly understood from the description of the preferred embodiments as set forth below with references to the accompanying drawings, wherein.

DESCRIPTION OF THE PREFERRED EMBODIMENTS

Below, embodiments of the present invention will be explained with reference to the drawings.

Using FIGS. 2A to 2D, in an electronic apparatus, an example of a board electrode provided on a printed circuit board, a device bottom electrode provided on an electronic device, and a solder joint will be explained.

Figure 1A:
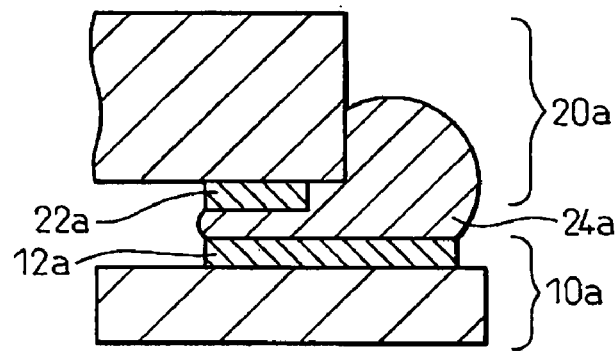
FIG. 1A is a side view showing a device bottom electrode, a board electrode of a board, and a solder joint.
Figure 1B:
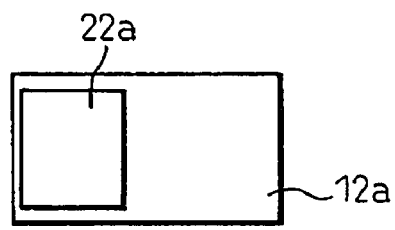
FIG. 1B is a top view showing the positional relationship between device bottom electrode and board electrode.
Figure 1C:
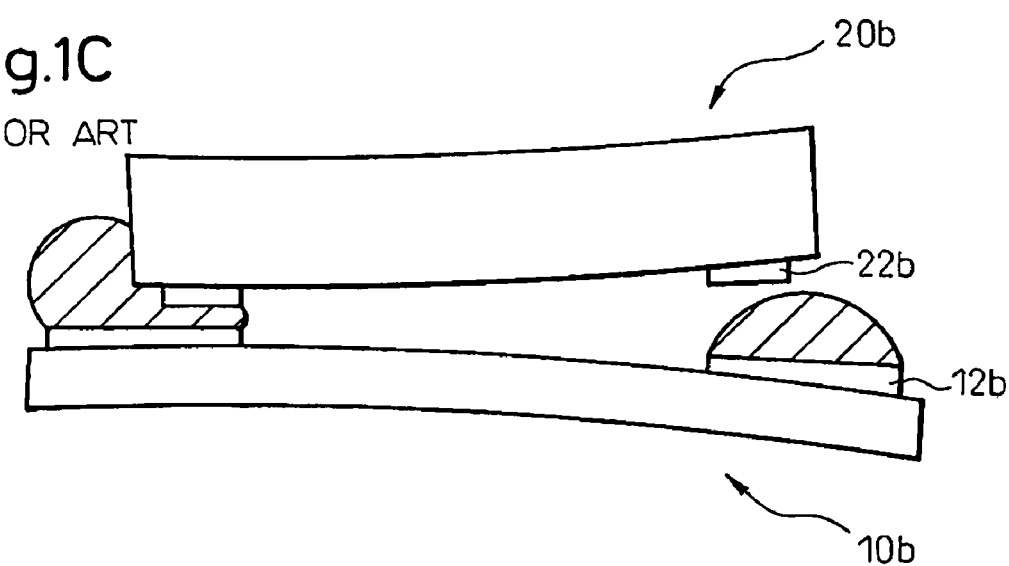
FIG. 1C is a side view showing the state where a device bottom electrode and a board electrode fail to bond.
Figure 2A:
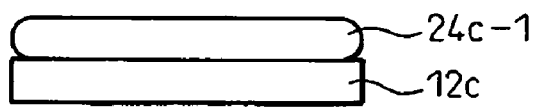
FIG. 2A is a side view showing the state before reflow where a board electrode is coated with solder paste.
Figure 2B:
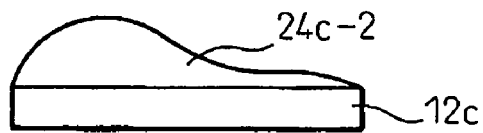
FIG. 2B is a side view showing the shape of solder paste, coated on the board electrode, at the time of reflow.
Figure 2C:
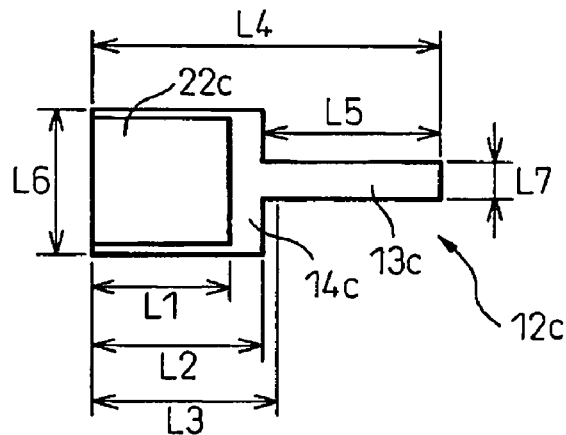
FIG. 2C is a top view showing the positional relationship between a device bottom electrode and board electrode.
Figure 2D:
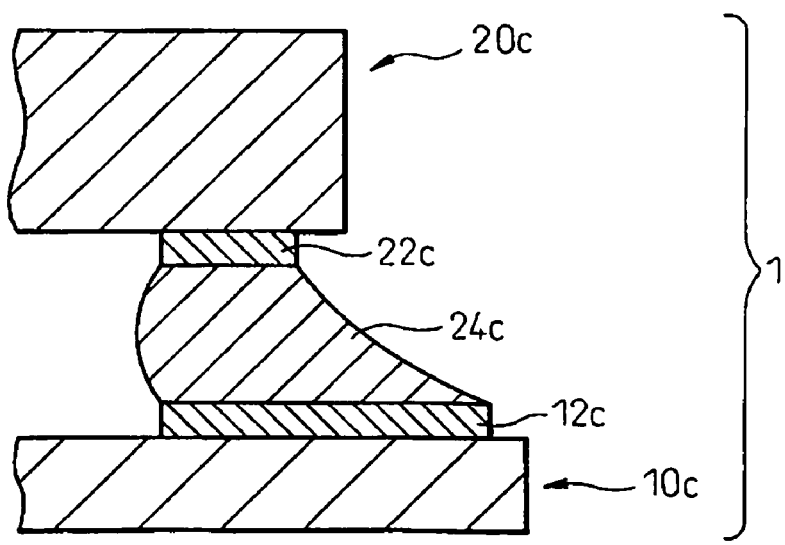
FIG. 2D is a side view showing the state where a device bottom electrode and a board electrode are bonded.

FIG. 2A is a side view showing the state before reflow where a board electrode 12c is coated with a solder paste, FIG. 2B is a side view showing the shape of the solder paste, coated on the board electrode 12c, at the time of reflow, FIG. 2C is a top view showing the positional relationship between a device bottom electrode 22c and a board electrode 12c having a board electrode base 14c and a projection 13c, and FIG. 2D is a side view showing the state where a device bottom electrode 22c of an electronic device 20c and a board electrode 12c of the printed circuit board 10c are bonded through a solder joint 24c in an electronic apparatus 1.

The board electrode 12c shown in FIG. 2C has a board electrode base 14c and projection 13c. The projection 13c is reduced in area, whereby the flow of molten solder outside of the electronic device is prevented, the molten solder is kept between the electrodes, and a fillet shape solder joint 24c shown by FIG. 2D is formed. By forming such board electrodes and arranging them on the printed circuit board, fillet shape solder joints 24c are formed at the reflow soldering and the level of the molten solder between the electrodes becomes higher, so it is possible to absorb warping of the electronic device 20c and printed circuit board 10c at the time of reflow and possible to avoid the bonding failure phenomenon.

Note that the projections 13c are connected to not shown conductors on the printed circuit board so as to electrically connect the electronic device 20c to other electronic devices etc. on the printed circuit board.

Furthermore, the longitudinal dimension L2 of the board electrode base 14c of the board electrode 12c shown in FIG. 2C is longer than the longitudinal dimension L1 of the device bottom electrode 12c and furthermore is shorter than the dimension L3 from the end of the inside of the electronic device on the board electrode base 14c to the outer periphery of the electronic device 20c. Further, the width dimension L7 of the projection 13c is shorter than the width dimension L6 of the board electrode base 14c for making the molten solder move.

In this way, the board electrode bases 14c are arranged at the inside from the outer periphery of the electronic device 20c, so the board electrodes are prevented from being extended in the direction of the outer edge of the electronic device and the area occupied by an electronic device having device bottom electrodes on the printed circuit board is reduced.

FIG. 2A is a side view showing the state before reflow where a board electrode 12c is coated with solder paste 24c-1. Since this is before reflow, the state is shown where the solder paste is coated on the printed circuit board 12c by exactly the thickness of the opening of the not shown printing plate.

FIG. 2B is a side view showing the molten solder 24c-2 coated on the board electrode 12c at the time of reflow. This shows the state where reflow heating causes the solder paste to melt and the surface tension of the molten solder acting between the device bottom electrode 22c and board electrode 12c causes the solder to move to the device bottom electrode 22c side. In this way, the solder paste 24c-1 shown in FIG. 2A melts, then, as shown in FIG. 2B, the molten solder 24c-2 moves between the bottom electrode 22c and board electrode base 14c whereby the level of the molten solder becomes higher.

Using FIGS. 3A to 3D, an example of the method of reflow soldering an electronic device on to a printed circuit board will be explained.

Figure 3A:
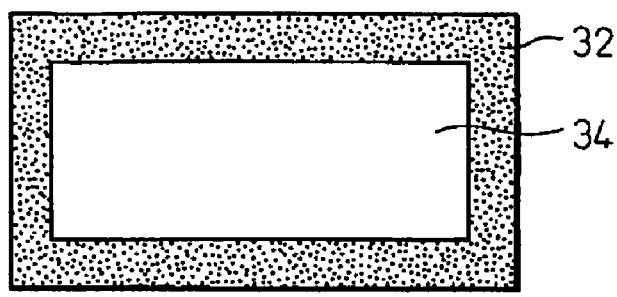
FIG. 3A is a top view of a printing plate.
Figure 3B:
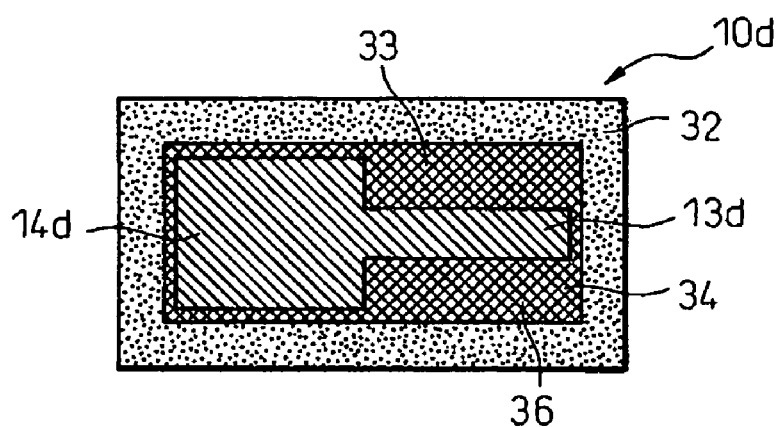
FIG. 3B is a top view of a printed circuit board having the printing plate arranged at its top surface and coated with solder paste.
Figure 3C:
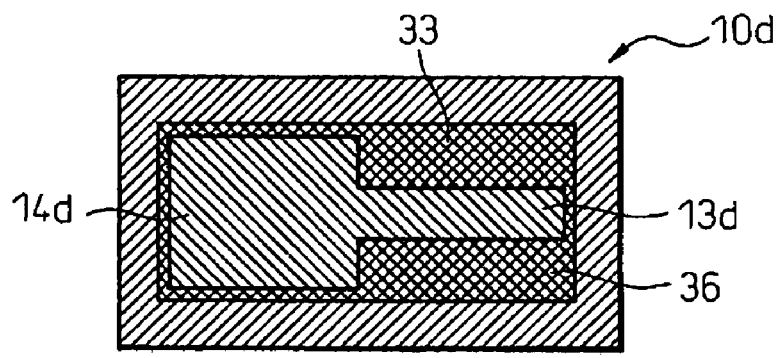
FIG. 3C is a top view of a printed circuit board, from which the printing plate has been removed and coated on its board electrode with solder paste, in the state before reflow.
Figure 3D:
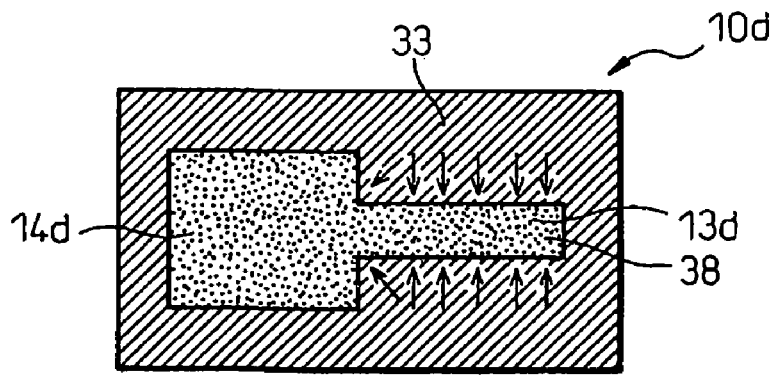
FIG. 3D is a top view of a printed circuit board on which molten solder after reflow moves on to the board electrode.

FIG. 3A is a top view of a printing plate 32 having an opening 34 for coating a board electrode with a solder paste, FIG. 3B is a top view of a printed circuit board 10d over which a printing plate 32 is placed and on which a solder paste 36 is coated, FIG. 3C is a top view of printed circuit board 10c, from which a printing plate 32 is removed and on the board electrode 13d, 14d of which a solder paste 36 is coated, in the state before reflow, and FIG. 3D is a top view of a printed circuit board 10d in the state with the reflowed molten solder 38 moved on to the board electrode 13d, 14d.

Note that in FIGS. 3A to 3D, for explanation, the reflow soldering of a single board electrode was explained, but an actual printed circuit board has a large number of board electrodes.

As shown in FIG. 3A, the printing plate 32 has an opening 34 for coating a board electrode 13d, 14d of the printed circuit board 10d with solder paste.

FIG. 3B shows a printed circuit board 10d on the top surface of which a printing plate 32 has been arranged and a solder paste 36 coated on the printed circuit board 10d. By coating a solder paste on the printing plate 32, the solder paste 36 enters through the opening 34 and the solder paste 36 is coated on the board electrode comprised of the board electrode base 14d and projection 13d. Note that the printed circuit board 10d is treated at its surface at portions other than the board electrode so as to be resistant to deposition of molten solder, that is, is given a solder resist 33.

Note that the opening 34 has a rectangular shape not having any projecting shape matching with the shape of the projection 13*d* of the board electrode, having an area larger than the board electrode comprised of the board electrode base 14*d* and projection 13*d*, and covering the board electrode. The opening 34 is made a rectangular shape in this way since if the opening 34 has a projecting shape matching the projection 13*d*, the projecting shape of the printing plate 32 will snag the squeegee etc. for coating the solder paste. Therefore, bending of the projecting shape of the printing plate 32 can be avoided.

FIG. 3C shows the state where the printing plate 32 is removed from the printed circuit board 10*d* coated with the solder paste 36 shown in FIG. 3B. As illustrated, the solder paste 36 is coated on the board electrode base 14*d* and projection 13*d* in accordance with the rectangular shape of the opening 34 of the printing plate 32.

FIG. 3D shows the state where the printed circuit board 10*d* coated with the solder paste shown in FIG. 3C is reflowed to make the solder paste 34 melt and where the molten solder 38 moves on to the board electrode 13*d*, 14*d*. The printed circuit board 10*d* is treated on its surface with the solder resist 33, so as shown by the arrows, the molten solder moves from the projection 13*d* on to the board electrode base 14*d* due to the surface tension of the molten solder 38 caused by the reflow.

Note that in the above explanation, the opening of the printing plate was made a rectangular shape, but the opening is not necessarily limited to this shape. It is sufficient that it be a shape not snagging a squeegee etc. for coating the solder paste and covering the board electrode.

Using FIGS. 4A to 4D, examples of an opening of a printing plate having a shape other than a rectangle will be explained.

Figure 4A:
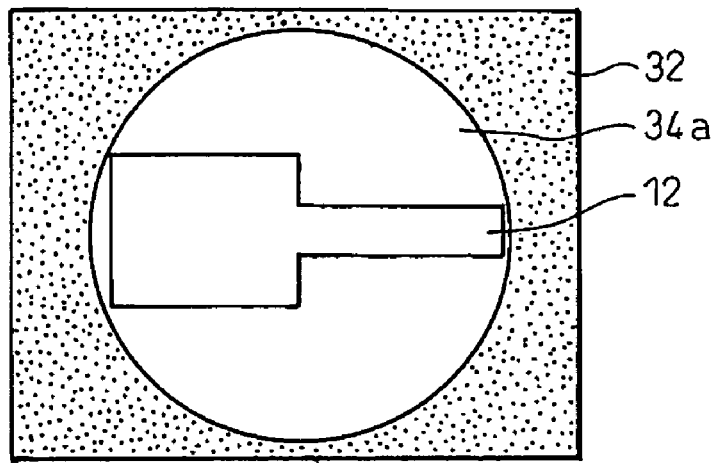
FIG. 4A is a top view of a circular printing plate opening, FIG. 4B of an elliptical printing plate opening, FIG. 4C of a semicircular printing plate opening, and FIG. 4D of a fan-shaped printing plate opening.
Figure 4B:
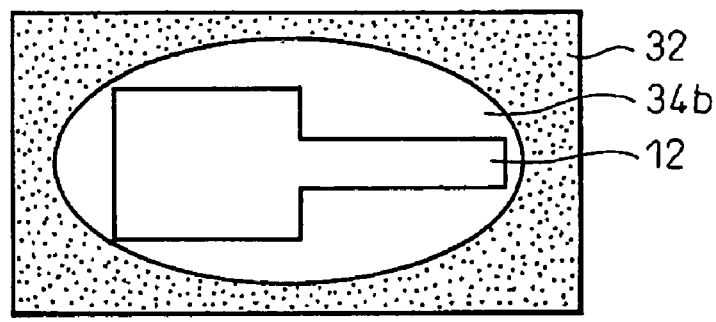
Figure 4C:
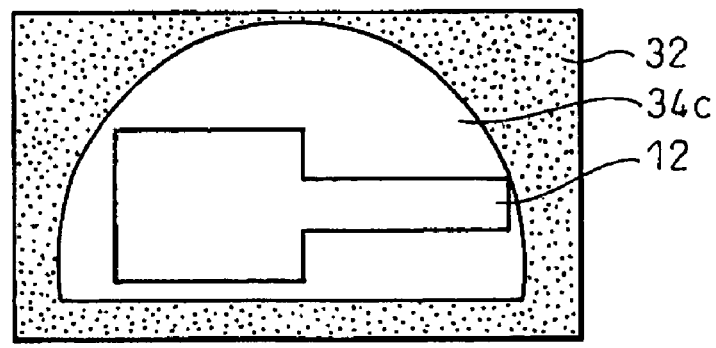
Figure 4D:
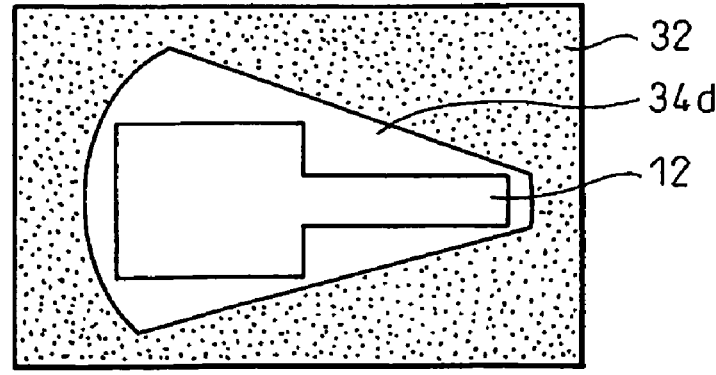

FIG. 4A is a top view showing a circular printing plate opening 34*a*, FIG. 4B an elliptical printing plate opening 34*b*, FIG. 4C a semicircular printing plate opening 34*c*, and FIG. 4D a fan-shaped printing plate opening 34*d*.

The illustrated openings having circular, elliptical, semispherical, fan-shaped, and other shapes do not have projecting shapes and do not snag squeegees etc. for coating the solder paste. In the step of coating the paste, it is possible to avoid part of the printing plate 32 from being bent. Further, the state is shown where the printed circuit board 10*d* coated with the paste is reflowed so that the solder paste 34 melts and where the molten solder 38 moves on the board electrode. The printed circuit board 10*d* is treated on its surface with solder resist 33, so the molten solder moves from the projection 13*d* on to the board electrode base 14*d* due to the surface tension of the molten solder 38.

In this way, in the method of production of an electronic apparatus according to the present invention, a printing plate having a rectangular, circular, elliptical, semicircular, or fan-shaped opening is used for reflow soldering while avoiding the formation of solder balls leading to short-circuit accidents etc. between the electronic device electrodes on the printed circuit board.

Many different embodiments of the present invention may be constructed without departing from the scope of the present invention, and it should be understood that the present invention is not limited to the specific embodiments described in this specification, except as defined in the appended claims.

What is claimed is:

1. A printed circuit board, comprising:
   a board electrode base having a first rectangular shape, for carrying by soldering a bottom electrode of an electronic device, arranged inside from the outer edges of the electronic device; and
   a projection, having a second rectangular shape and projecting out from the board electrode base, narrower in width than the board electrode base, and connected to an interconnect of the printed circuit board, a part of the projection arranged outside from an outer edge of the electronic device;
   wherein a surface of the bottom electrode of the electronic device opposite the board electrode base is soldered to the board electrode base, molten solder moves from the projection to the board electrode base due to surface tension of the molten solder, and a fillet shape solder joint is formed from the surface of the bottom electrode of the electronic device to the part of the projection.

2. The printed circuit board according to claim 1, wherein the board electrode base is larger than the bottom electrode.

3. The printed circuit board according to claim 1, wherein a surrounding of the board electrode base and the projection is treated with a solder resist.

4. A method of production of an electronic apparatus comprising:
   forming, on a printed circuit board, a board electrode base having a first rectangular shape, for carrying by soldering a bottom electrode of an electronic device, arranged inside from outer edges of the electronic device, and a projection having a second rectangular shape and projecting out from the board electrode base, narrower in width than the board electrode base, and connected to an interconnect of the printed circuit board, a part of the projection arranged outside from an outer edge of the electronic device;
   arranging on the printed circuit board a printing plate having patterns from which the board electrode base and the projection are exposed;
   coating the board electrode base and the projection with a solder paste;
   removing the printing plate and placing the bottom electrode of the electronic device on the board electrode base coated with the solder paste; and
   soldering together the board electrode base and a surface of the bottom electrode of the electronic device opposite the board electrode base, wherein molten solder moves from the projection to the board electrode base due to surface tension of the molten solder, and a fillet shape solder joint is formed from the surface of the bottom electrode of the electronic device to the part of the projection.

5. The method of production of an electronic apparatus according to claim 4, wherein the patterns of the printing plate are rectangular, circular, elliptical, semicircular, or fan-shaped.

6. The method of production of an electronic apparatus according to claim 4, wherein a surrounding of the board electrode base and the projection are treated with solder resist.

7. A printed circuit board carrying an electronic device with outer edges and a bottom electrode, comprising:
   an interconnect; and
   a board electrode base having a first rectangular shape disposed inside the outer edges of the electronic device, except for a projection, connected to the interconnect of the printed circuit board and narrower in width than a maximum width of the board electrode base, a part of the projection having a second rectangular shape projecting out beyond one of the outer edges of the electronic device, wherein a surface of the bottom electrode of the electronic device opposite the board electrode base is soldered to the board electrode base by a fillet shape solder joint, from the surface of the bottom electrode of the electronic device to the part of the projection, formed when molten solder moves from the projection to the board electrode base due to surface tension of the molten solder.

* * * * *